United States Patent [19]

Narashimhan et al.

[11] Patent Number: 5,155,656

[45] Date of Patent: Oct. 13, 1992

[54] INTEGRATED SERIES CAPACITORS FOR HIGH RELIABILITY ELECTRONIC APPLICATIONS INCLUDING DECOUPLING CIRCUITS

[75] Inventors: Varadarajan L. Narashimhan; Glen G. Atkins; Robert B. Boatright, all of Boise, Id.

[73] Assignee: Micron Technology, Inc., Boise, Id.

[21] Appl. No.: 806,156

[22] Filed: Dec. 12, 1991

[51] Int. Cl.[5] .......................... H01G 1/14; H01G 4/10
[52] U.S. Cl. ...................................... 361/309; 361/321
[58] Field of Search .............. 361/306, 308, 309, 310, 361/328, 329, 330, 320, 321; 29/25.42

[56] References Cited

U.S. PATENT DOCUMENTS

| | | | |
|---|---|---|---|
| 3,189,974 | 6/1965 | Fabricius | 29/25.42 |
| 3,900,788 | 8/1975 | Behn et al. | 321/15 |
| 4,991,055 | 2/1991 | Marneffe et al. | 361/321 |
| 5,043,533 | 8/1991 | Spielberger | 361/306 X |
| 5,093,774 | 3/1992 | Cobb | 361/306 |
| 5,103,283 | 4/1992 | Hite | 357/51 |

*Primary Examiner*—Donald A. Griffin
*Attorney, Agent, or Firm*—Nydegger & Associates

[57] ABSTRACT

An integrated series capacitor includes two capacitors mounted in series in a unitary insulated package. The capacitors are formed of stacked plates separated by a dielectric material. Every other stacked plate for each capacitor terminates along an outer termination edge that is connected to a solder connection on an end of the insulated package. These stacked plates alternate with every other plate which has an inner termination edge. The inner termination edges of each capacitor are connected. The integrated series capacitor is adapted for connection to a circuit board between a chip supply voltage (Vss) and a ground connection (Vss) to provide a decoupling circuit to replace two separate series wired capacitors.

16 Claims, 1 Drawing Sheet

INTEGRATED SERIES CAPACITORS FOR HIGH RELIABILITY ELECTRONIC APPLICATIONS INCLUDING DECOUPLING CIRCUITS

TECHNICAL FIELD

This invention relates to electronic devices and more particularly to decoupling circuits and decoupling capacitors adapted to be used as high frequency bypass filters on circuit boards.

BACKGROUND OF THE INVENTION

Microchip fabrication involves the formation of integrated circuits (ICs), on a semiconducting substrate. A large number of semiconductor devices or ICs are typically constructed on a monolithic substrate of a single crystal silicon material. The area on the wafer occupied by a discrete device or IC is called a chip or die. After formation, the individual chips are separated and connected by gold wires to a lead frame. Typically, the chips are then packaged in a plastic or ceramic package that is necessary to protect the chip and provide a substantial electrical lead system.

IC chips come in a variety of forms, such as dynamic random access memory (DRAM) chips, static random access memory (SRAM) chips, processor chips, logic chips, etc. For forming electronic devices, a number of chips are electrically connected on printed circuit boards by techniques such as socketing or soldering. Printed conductive traces on the circuit boards are used to electrically connect the IC chips in the desired electrical arrangement. Often several conductive traces are routed adjacent to one another in an area expressly allocated for signal routing (bussing), and these traces can run parallel to one another for a distance.

The semiconductor devices within the IC chips are essentially switching devices for generating an output signal responsive to a driver. As the output drivers connected to the chips, create intermittent current flow, the conductive traces on the circuit board act as inductors creating voltage surges. These voltage surges have the potential for creating logic errors. If a conductive trace carries a fluctuating signal, whether it be an alternating current signal, such as a clock signal, or a pulsating direct current, the signal will, to some extent, be capacitively coupled to other components of the system.

As an example, capacitive coupling can occur between adjacent conductive traces as the ICs transition between high and low levels. A static signal, for instance can be boosted above the power supply voltage or below ground, resulting in charge injection through diffusions into the substrate or well of the ICs. Such injections can cause loss of data at dynamic storage nodes (i.e. DRAM cells) or, at worst, latchup. In addition, other transient voltages, such as voltage fluctuations in the power source and fluctuations caused by the interaction of other circuit components may cause logic errors.

In order to overcome these logic problems created by transient voltages, decoupling capacitors are commonly used as high frequency bypass filters in printed circuit boards. U.S. Pat. No. 4,879,631 to Johnson et al and assigned to Micron Technology, Inc., assignee of the present application, discloses such a decoupling capacitor system. This system comprises one or more units of two or more series connected capacitors connected between the chip supply voltage (Vcc) input and the chip ground (Vss) connection.

A sketch of such a system is shown in FIG. 1 for a SIMM having a plurality of DRAM chips. As shown in FIG. 1, each DRAM chip includes eighteen chip connector pads represented by the terminal nodes on a (Vcc) bus 10 and a (Vss) bus 12. This system includes four pairs of series connected capacitors (C1,C2), (C3,C4), (C5,C6), (C7,C8) connected to form separate decoupling circuits between the appropriate terminals of a SIMM's (Vcc) bus 10 and its ground plane (Vss) bus 12. As is apparent, the failure of any one capacitor (C1-C8) in a pair of capacitors will double the capacitance in the decoupling circuit of the failed capacitor. This is because the total capacitance of two identical capacitors in series is only half the capacitance of each. In general, two capacitors used as a decoupling circuit is a significant improvement over a one capacitor circuit because if only a single capacitor were included in each decoupling circuit, a short in any one of the capacitors would result in the (Vcc) bus 10 becoming shorted to the ground plane (Vss) bus 12.

In general, in such decoupling circuits the capacitors are surface mount components that are manufactured as separate components and adapted to be connected to the appropriate terminals of the circuit board by soldering. One suitable type of capacitor is known in the industry as a surface mount multi-layer ceramic chip capacitor. These surface mount capacitors include a large number of stacked parallel plates or electrodes, that are interleaved and separated by a ceramic dielectric. One edge of each plate terminates along a common plane and these terminating edges are connected to one another with a conductive metal. The plates are fabricated and connected with a conductive material such as nickel, or an alloy, such as palladium/silver. The entire assembly is encapsulated in a sealed insulated package having solder plating on either end for connection to the circuit board.

Such decoupling capacitors are particularly susceptible to shorting, since they have no leads to thermally isolate them and are soldered to a circuit board at temperatures of up to 700 degrees Fahrenheit. In addition such decoupling capacitors are vulnerable to mechanical stresses that would not affect a lead mount capacitor. As an example, bending or flexure of the circuit board may miss-align the delicate stacked and interleaved plates of the capacitors.

These problems are compounded because a circuit such as that shown in FIG. 1 requires that two capacitors be wired in series between the appropriate terminals. Two separate capacitors are thus required for each circuit, and each capacitor must be assembled and wired separately onto the circuit board. In addition, with two capacitors required for each circuit, a parts count and density are increased, and the probability of inserting a defective capacitor is increased.

The present invention is directed to such a capacitor in which two capacitors are assembled during manufacture, in series, as a monolithic or unitary package. The unitary package can then be wired to the circuit board in place of two separate capacitors. This construction is intended to overcome some of the problems associated with the use of two separate capacitors in a decoupling circuit.

Accordingly it is an object of the present invention to provide a surface mount capacitor for circuit boards that includes a pair of series connected capacitors in a unitary package for use as a decoupling circuit. It is another object of the present invention to provide a capacitor that improves the reliability of decoupling circuits. Another object of the present invention is to provide a capacitor for decoupling circuits that reduces circuit board assembly costs and reduces board component density.

SUMMARY OF THE INVENTION

In accordance with the present invention a novel integrated, series, capacitor is provided. The capacitor, simply stated, includes two capacitors connected in series in a unitary or monolithic package. In a preferred embodiment the capacitors comprise interleaved plates or electrodes assembled to provide two series connected capacitors.

More particularly stated the integrated series capacitor comprises:
a. a first and a second capacitor each including;
  i. a first set of stacked plates separated by a dielectric and connected to one another along an outer termination edge;
  ii. a second set of stacked plates separated by a dielectric and connected to one another along an inner termination edge common to both capacitors;
b. an insulated sealed package for enclosing the first and second capacitors; and
c. connection means in the form of a solder connection at a first end of the sealed package connected to the outer termination edge of the first capacitor, and a solder connection at a second end of the sealed package connected to the outer termination edge of the second capacitor for soldering the capacitor to a circuit board.

The integrated series capacitor is especially but not exclusively adapted to be used in a decoupling circuit for a circuit board to improve the reliability of the decoupling circuit. The capacitor of the invention could however, be used in other digital and/or analog circuitry applications. Other objects, advantages, and capabilities of the present invention will become more apparent as the description proceeds.

DESCRIPTION OF PREFERRED EMBODIMENTS

Figure 2:
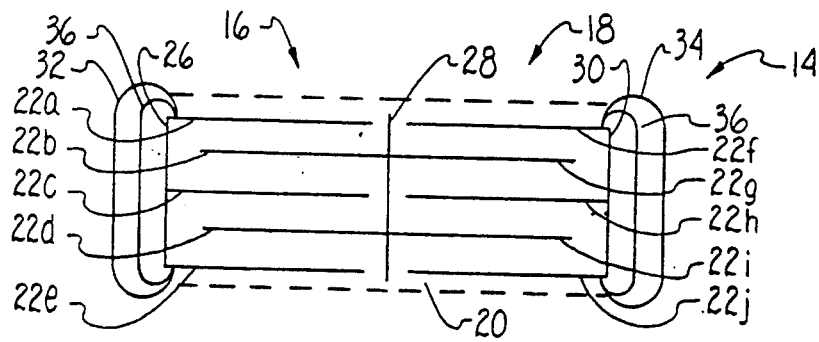
FIG. 2 is a schematic cross section of an integrated series capacitor constructed in accordance with the invention.
Figure 3:
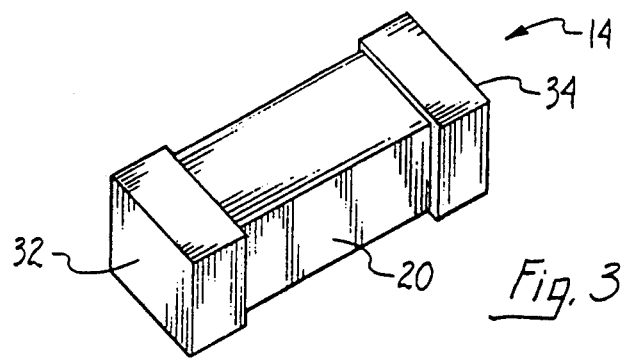
FIG. 3 is a perspective view of an integrated series capacitor constructed in accordance with the invention.

Referring now to FIGS. 2 and 3 a surface mount integrated series capacitor constructed in accordance with the invention is shown and generally designated as 14. The integrated series capacitor 14 includes a first capacitor 16 and a second capacitor 18 connected in series and packaged together in a unitary package 20. A solder connection 32,34 is formed at either end of the insulated package 20 for connecting the integrated series capacitor 14 to a circuit board or the like.

Each separate capacitor 16, 18 includes a plurality of individual plates or electrodes 22 that are stacked and separated by a dielectric material 24. The first capacitor 16, includes plates 22a-e, and the second capacitor 18 includes plates 22f-j. Alternately a greater or lesser number of electrodes 22a-j may be included.

Each electrode 22a-j is flat and planar and has a generally rectangular outer peripheral configuration. The electrodes 22a-j are formed as separate leaves and may be extremely thin or foil-like in thickness. In addition, the electrodes 22a-j may be constructed of any conductive material. Preferred materials include nickel, and a palladium/silver alloy. Each electrode 22a-j is separated by an insulating material 24 such as a ceramic dielectric.

As shown schematically in FIG. 2, the electrodes 22a-j for each capacitor 16, 18 are stacked in an alternating array. One end of each electrode 22a-j is simply embedded in the ceramic material 24. The opposite end of each electrode 22a-j is connected along a common edge, termed herein as the "termination edge". The term "inner" termination edge refers to a termination edge located adjacent to the inner or middle portion of the insulated package 20. The term "outer" termination edge refers to a termination edge located adjacent to an end of the insulated package 20. For capacitor 16, one end of every other electrode (i.e. 22a, c, e) terminates along an outer termination edge 26. One end of the alternating in between electrodes (i.e. 22b, d) for capacitor 16 terminates at an inner termination edge 28.

The second capacitor 18 has the same type of stacked alternating edge construction with each electrode 22f-j having a terminating edge. For capacitor 18, one end of every other electrode (i.e. 22f, h, j) terminates at an outer termination edge 30. One end of the alternating in between electrodes (i.e. 22g, i) for capacitor 18 terminates at an inner termination edge 28. As is apparent, the inner termination edges 28 are common to the electrodes for the first capacitor 16 and the electrodes for the second capacitor 18 (i.e. 22b, d and 22g, i terminate along a common inner termination edge).

The outer termination edges 26 of the electrodes 22a-e, for capacitor 16, are connected to one another by a means such as thermal bonding, (i.e. soldering) and are also connected to the solder connection 32. Likewise the outer termination edges 30 of the electrodes 22f-j for capacitor 18 are connected to one another by a means such as thermal bonding, (i.e. soldering), and are also connected to the solder connection 34.

A material for connecting the outer termination edges 26, 30 and the inner termination edges 28, of the capacitors 18, 20 is preferably the same as the electrode material (i.e. nickel, palladium/silver). The solder connections 32,34 are preferably formed of a solderable material such as tin or a tin/lead alloy. A barrier layer 36 of a material such as nickel may also be formed between the outer termination edges 26, 30 and the solder connections 32, 34.

The exterior of the unitary package 20 is formed of an insulative material such as plastic or resin. As shown in FIG. 3, the assembled unitary package 20 may have a generally rectangular outer peripheral configuration with an inner portion wherein the inner termination edges are located and end portions for the solder connections 32, 34. The distance between the solder connections 32, 34 may be accurately controlled to maintain the dimensional control required for circuit board assembly.

Figure 1:
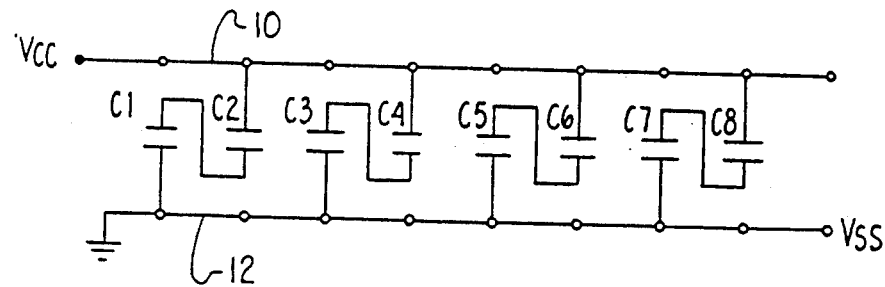
FIG. 1 is an electrical schematic diagram of a prior art decoupling capacitor circuit.
Figure 4:
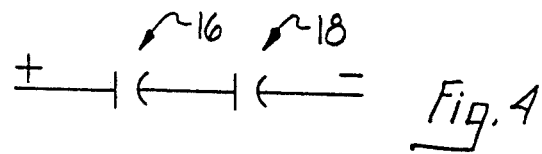
FIG. 4 is an electrical schematic diagram of the integrated series capacitor shown in FIG. 2.

An assembled integrated series capacitor 14 forms the electrical circuit shown in FIG. 4 (i.e. two capacitors wired in series). The integrated series capacitor 14 can then be used in decoupling circuits such as that shown in FIG. 1 to replace two separate capacitors connected in series.

An integrated series capacitor constructed in accordance with the invention provides the following advantages over multiple surface mount capacitors used in semiconductor circuit board fabrication:

1. Increased reliability of a system/subsystem by decreasing the parts count.
2. Reduction in board component density.
3. Reduced insertion and circuit board assembly costs.
4. Inventory reduction of bypass capacitors by at least 50%.
5. Decreased printed wiring circuit board design time.
6. Increased system fault tolerance.

Thus the invention provides a simple yet unobvious surface mount integrated series capacitor for semiconductor circuit boards. This invention is especially adapted to replace separate capacitors used in circuit boards for electronic circuits. The invention however, is also applicable to other types of digital/analog electronic circuitry where high reliability is desired. Therefore, although the preferred embodiment of the invention and the following claims are directed primarily to decoupling capacitors for circuit boards, other embodiments are covered by the scope and spirit of the claims.

We claim:

1. A surface mount integrated series capacitor comprising :
   a first and a second capacitor connected in series ; an insulated sealed package for enclosing the first and second capacitors ; said capacitors being formed of stacked plates separated by a dielectric material and in which each plate has a termination edge and with an outer termination edge of every other plate for the first and second capacitors connected to one another end to the connection means at either end of the sealed package and with an inner termination edge of every other plate for the first and second capacitors connected to one another and to a common inner termination edge ; and
   connection means associated with the first and second capacitors for connecting the integrated series capacitor to a circuit board.

2. The integrated series capacitor as claimed in claim 1 and wherein:
   the connection means comprises solder material at either end of the sealed package.

3. The integrated series capacitor as claimed in claim 2 and wherein:
   the integrated series capacitor is used in a decoupling circuit on a circuit board.

4. The integrated series capacitor as claimed in claim 2 and wherein:
   a barrier layer is located between the solder material and the outer termination edges.

5. A surface mount integrated series capacitor comprising:
   a. a first and a second capacitor each including;
      i. a first set of stacked plates separated by a dielectric material and connected at an outer termination edge;
      ii. a second set of stacked plates alternating in between the first set of stacked plates separated by a dielectric and connected at an inner termination edge common to both capacitors;
   b. an insulated sealed package for enclosing the first and second capacitors; and
   c. connection means connected to the outer termination edges of the first capacitor and to the outer termination edges of the second capacitor for connecting the integrated series capacitor to a circuit board.

6. The integrated series capacitor as claimed in claim 5 and wherein:
   the stacked plates are formed of a leaf-like material embedded in a ceramics dielectric.

7. The integrated series capacitor as claimed in claim 6 and wherein:
   the connection means comprises solder material at either end of the insulated sealed package.

8. The integrated series capacitor as claimed in claim 7 and wherein:
   the integrated series capacitor is used in a decoupling circuit on a circuit board.

9. The integrated series capacitor as claimed in claim 7 and wherein:
   the stacked plates are formed of nickel.

10. The integrated series capacitor as claimed in claim 7 and wherein:
    the stacked plates are formed of a palladium/silver alloy.

11. The integrated series capacitor as claimed in claim 7 and further comprising:
    a barrier layer formed between the solder material and outer termination edges of each capacitor.

12. A circuit board surface mount integrated series capacitor for use in a decoupling circuit to replace two separate capacitors wired in series, comprising:
    a first capacitor formed of a plurality of stacked plates separated by a dielectric material and with a first set of every other plate having a first edge embedded in the dielectric material and an outer termination edge connected to one another and a second set of every other plate having a first edge embedded in the dielectric material and an inner termination edge connected to one another;
    a second capacitor formed of a plurality of stacked plates separated by a dielectric material and with a first set of every other plate having a first edge embedded in the dielectric material and an outer termination edge connected to one another and a second set of every other plate having a first edge embedded in the dielectric material and an inner termination edge connected to one another and to the inner termination edges of the second set of plates of the first capacitor; and
    an insulated sealed package for enclosing the first and second capacitors, having solder material at either end connected to the outer termination edges of the first and second capacitors respectively for connection to the circuit board.

13. The integrated series capacitor as claimed in claim 12 and wherein:
    the dielectric material is a ceramic.

14. The integrated series capacitor as claimed in claim 12 and wherein:
    the plates are formed of nickel.

15. The integrated series capacitor as claimed in claim 12 and wherein:
    the plates are formed of a palladium/silver alloy.

16. The integrated series capacitor as claimed in claim 12 and wherein:
    the integrated series capacitor is connected between a supply voltage (Vcc) input and a ground (Vss) connection for a semiconductor chip.

* * * * *